(12) United States Patent
Zhang et al.

(10) Patent No.: US 11,215,667 B1
(45) Date of Patent: Jan. 4, 2022

(54) INTERVAL ESTIMATION FOR STATE-OF-CHARGE AND TEMPERATURE IN BATTERY PACKS WITH HETEROGENEOUS CELLS

(71) Applicants: TOTAL S.A., Paris la Défense (FR); University of California—Berkeley, Berkeley, CA (US); Université Libre de Bruxelles, Brussels (BE)

(72) Inventors: Dong Zhang, Albany, CA (US); Preet Gill, El Sobrante, CA (US); Scott Moura, Berkeley, CA (US); Luis Couto, Oxford (GB); Sebastien Benjamin, Leognan (FR); Wente Zeng, San Francisco, CA (US)

(73) Assignees: TOTAL S.A., Paris la Défense (FR); University of California—Berkeley, Berkeley, CA (US); Université Libre de Bruxelles, Brussels (BE)

( * ) Notice: Subject to any disclaimer, the term of this patent is extended or adjusted under 35 U.S.C. 154(b) by 0 days.

(21) Appl. No.: 16/911,179

(22) Filed: Jun. 24, 2020

(51) Int. Cl.
*G01R 31/367* (2019.01)
*G05B 13/04* (2006.01)
*G01R 31/396* (2019.01)
*G01R 31/387* (2019.01)
*G01R 31/3842* (2019.01)
*G01K 13/00* (2021.01)
*G01R 31/374* (2019.01)

(52) U.S. Cl.
CPC .......... *G01R 31/367* (2019.01); *G01K 13/00* (2013.01); *G01R 31/3842* (2019.01); *G01R 31/396* (2019.01); *G05B 13/04* (2013.01); *G01R 31/374* (2019.01); *G01R 31/387* (2019.01)

(58) Field of Classification Search
None
See application file for complete search history.

(56) References Cited

U.S. PATENT DOCUMENTS

| | | |
|---|---|---|
| 2014/0361743 A1 | 12/2014 | Lin et al. |
| 2015/0147608 A1* | 5/2015 | Lin ............... G01R 31/3648 429/62 |
| 2015/0326038 A1 | 11/2015 | Lee |
| 2016/0301219 A1* | 10/2016 | Desprez .......... G01R 31/389 |
| 2017/0235858 A1* | 8/2017 | Tate, Jr. ............ G06F 30/20 703/2 |
| 2019/0041464 A1* | 2/2019 | Chow ............. G01R 31/3646 |

OTHER PUBLICATIONS

Zhang et al., "Real-Time Capacity Estimation of Lithium-Ion Batteries Utilizing Thermal Dynamics" IEEE Transactions on Control Systems Technology, vol. 28, No. 3, May 2020 (Year: 2020).*

(Continued)

*Primary Examiner* — John C Kuan
(74) *Attorney, Agent, or Firm* — Oblon, McClelland, Maier & Neustadt, L.L.P.

(57) ABSTRACT

An interval observer based on an equivalent circuit-thermal model for lithium-ion batteries is presented. State of charge-temperature-dependent parameters are considered as unknown but bounded uncertainties in a single cell model. A parallel and a series arrangement of five cells are used for observer design, where cell heterogeneity is accounted for through the uncertainty bounding functions.

4 Claims, 8 Drawing Sheets

(56) References Cited

OTHER PUBLICATIONS

Dey et al., "Nonlinear Adaptive Observer for a Lithium-Ion Battery Cell Based on Coupled Electrochemical-Thermal Model" Journal of Dynamic Systems, Measurement, and Control Nov. 2015, vol. 137 / 111005-1 (Year: 2015).*

Lin et al., "Online Parameterization of Lumped Thermal Dynamics in Cylindrical Lithium Ion Batteries for Core Temperature Estimation and Health Monitoring" IEEE Transactions on Control Systems Technology, vol. 21, No. 5, Sep. 2013 (Year: 2013).*

International Search Report and Written Opinion dated Oct. 7, 2021 in corresponding International Application No. PCT/US2021/038456.

Huong Dinh Cong et al: "Design of Functional Interval Observers for a Battery and Motor Circuit Model of Electric Vehicle", 2019 VPPC, IEEE, Oct. 14, 2019, pp. 1-6, XP033687859.

Zhang Dong et al: "Interval Observer for SOC Estimation in Parallel-Connected Lithium-ion Batteries", 2020 AACC, Jul. 1, 2020, pp. 1149-1154, XP033797039.

* cited by examiner 5-cell in parallel

INTERVAL ESTIMATION FOR STATE-OF-CHARGE AND TEMPERATURE IN BATTERY PACKS WITH HETEROGENEOUS CELLS

TECHNICAL FIELD

The disclosure relates to estimating the operation of multiple lithium-ion batteries connected in series and in parallel, including estimating the state of charge and temperature of the batteries.

BACKGROUND

Lithium-ion (Li-ion) batteries play a key role in achieving energy sustainability and reduction in emissions. Li-ion batteries benefit from high energy density, which has motivated their wide use in a variety of applications including electric vehicles and grid energy storage. In recent years, a substantial body of research on real-time control and estimation algorithms for batteries has emerged. However, safe and efficient operation of batteries remains a challenge, especially as the performance requirements of these devices increase.

Energy storage systems for electric vehicles and large-scale grid applications often require hundreds to thousands of cells connected in series and in parallel to achieve the demanded power and voltage. A battery pack's instantaneous power capability is crucial for on-board management and safe operation. However, real-time state of charge (SOC) estimation for a battery pack is a very intricate task due to (i) limited measurements, (ii) complex electrochemical-thermal-mechanical physics, and (iii) high computational cost.

Different battery models for state observer design have been proposed in the literature, which can be classified into electrochemical white box models, equivalent-circuit gray box models, and data driven black box models, sorted from low to high physical interpretability. Although each modelling framework has their own merits and drawbacks, equivalent circuit models (ECMs) provide a reasonable trade-off between model complexity and accuracy. ECMs can be made more accurate by increasing the system order to account for additional electrochemical phenomena, like charge transfer, but at the expense of computational cost that grows polynomially with the number of states and linearly with the number of cells.

An important fact often ignored during battery modeling is the time-varying electrical parameters. In practice, internal parameters, e.g. resistances and capacitance, are nonlinearly dependent on the cell's temperature and SOC. Therefore, it is important to model cell temperature and its coupling with the electrical dynamics. High-fidelity temperature models have more accurate temperature predictions, but suffer from high computational cost, rendering them of little use for on-board thermal management systems. First principles-based two-state thermal models for the cell's core and surface temperatures provide a balanced trade-off between computational efficiency and fidelity.

Lumped equivalent circuit-thermal models with temperature dependent parameters have been studied and used for state estimation via an adaptive observer. Existing techniques for battery pack state estimation include Luenberger observers, Kalman filters (KFs), unscented Kalman filters (UKFs), and sliding mode observers, among others. However, all the previously mentioned techniques require a state observer for each cell within the pack, which makes them computationally intractable for large packs.

In the stochastic estimation/filtering framework, the process and measurement noises are often assumed to be Gaussian. The system characteristics, e.g., mean and variance, are required by filtering algorithms. Nonetheless, the statistical and calibration procedures to obtain these characteristics are often tedious. In contrast, interval estimation assumes that the measurement and process noises are unknown but bounded. The interval observer literature derives a feasible set for state estimation at every time instant. In a battery pack that consists of thousands of cells, executing state estimation algorithms based on highly non-linear and coupled dynamics for every single cell in real time becomes intractable. The interval observer benefits from its scalability by deriving only upper and lower bounds that enclose all unmeasured internal states for all cells in a pack. Previously, only Perez et al. in "Sensitivity-based interval PDE observer for battery SOC estimation" (American Control Conference, pp. 323-328, 2015), had designed a sensitivity-based interval observer for single cell SOC estimation from an electrochemical perspective, but without provable observer stability and inclusion properties.

SUMMARY

The internal states of Li-ion batteries, notably SOC, need to be carefully monitored during battery operation in order to prevent dangerous situations. SOC estimation in an electrically and thermally coupled parallel connection of cells is a particularly challenging problem because cells in parallel yield a system of differential algebraic equations, which are more difficult to handle than ordinary differential equations (e.g. a series string of cells). For a large battery pack with thousands of cells, applying an estimation algorithm on each and every cell would be mathematically and computationally intractable. The present application tackles these issues using an interval observer based on a coupled equivalent circuit-thermal model, and considers cell heterogeneity as well as state-dependent parameters as unknown, but with bounded uncertainty. The resulting interval observer maps bounded uncertainties to a feasible set of state estimation and is independent of the number of cells in connection (in parallel or in series). Stability and inclusion of the interval observer are proven and validated through numerical studies.

A robust interval observer, using the measurements, to determine the set of admissible values for cell SOC and temperature at each time instant, when the plant model is subject to bounded uncertainties in the parameters and states' initial conditions, is used.

In the present application, heterogeneous battery cells (where the cells are heterogeneous due to variations in health, temperature, and/or charge levels) in parallel and in series connection are both considered and analyzed, based on an interval observer design, given uncertain model parameters, initial conditions, and measurements. The approach is based upon the theory of interval observers (a.k.a. set-membership estimation). Interval observers provide an elegant approach to directly address the heterogeneity and scalability problems. Namely, heterogeneity is handled by conceptualizing parameters and inputs as existing within some membership set. Scalability is handled by designing a single observer, which estimates the range of SOC and temperature values across the battery pack.

Li-ion batteries are vulnerable to overcharge and overdischarge. Overcharge can lead to lithium deposition and electrolyte solvent decomposition, resulting in fire or even explosion. This issue is particularly critical for battery packs in plug-in hybrid electric vehicles (PHEVs) and battery electric vehicles (BEVs), since those batteries are usually charged to high SOC. In the meantime, the charging (and discharging) capability of a pack is determined by the cells with highest (lowest) SOC. Thus, to prevent overcharging, the cells with lower SOC cannot be fully charged after the cells with higher SOC have been fully charged. As a result, cells are not fully utilized when they are not balanced. In order to prolong the battery life cycle and increase the stack utilization, it is recommended that all the cells in a pack have the same SOC during battery operations. Cell equalization is performed based on the knowledge of the best and worst SOCs in a pack.

In real-world applications, e.g. BEVs, it is desirable to charge the battery pack as fast as possible. However, charging the battery with high current will significantly damage the Li-ion cells which could lead to catastrophic failure. Ensuring safe operating constraints is a basic requirement for batteries. For instance, while charging, SOC, core and surface temperatures (along with other important variables) of every single cell needs to be maintained within an operational bound to ensure pack safety. The interval observer provides such information that can be utilized to infer whether these variables violate the safe constraints.

Embodiments disclosed herein allow the estimation of SOC and temperature during operation of the batteries, followed by appropriate charging of the batteries within safe limits.

BRIEF DESCRIPTION OF THE DRAWINGS

The application will be better understood in light of the description which is given in a non-limiting manner, accompanied by the attached drawings in which.

DETAILED DESCRIPTION OF THE PREFERRED EMBODIMENTS

Reference throughout this specification to "one embodiment" or "an embodiment" means that a particular feature, structure, material, or characteristic described in connection with the embodiment is included in at least one embodiment of the application, but do not denote that they are present in every embodiment.

Thus, the appearances of the phrases "in one embodiment" or "in an embodiment" in various places throughout this specification are not necessarily referring to the same embodiment of the application. Furthermore, the particular features, structures, materials, or characteristics may be combined in any suitable manner in one or more embodiments.

Throughout, the symbol $I_{dn}$ denotes the identity matrix with dimension n×n. For a matrix $A \in R^{n \times n}$, $\|A\|_{max} = \max_{i,j=1,2,\ldots,n}|A_{i,j}|$ (the elementwise maximum norm). The relation $Q>0$ ($Q<0$) means that the matrix $Q \in R^{n \times n}$ is positive (negative) definite. The inner product between x, $y \in R^n$ is given by $<x, y> = \Sigma x_i y_i$, $i=1$ to n.

The embodiments described herein are widely applicable to energy storage systems (e.g. Li-ion batteries) comprising hundreds or thousands of dissimilar cells arranged in series and in parallel. Knowledge of these largescale systems is limited by the amount of sensing locations and cell heterogeneity. One of such examples, among many others, is the high energy pack module developed by Saft, which integrates 40,000 single cells of 18650 type. The module constitutes 20 strings of cells connected in parallel, where each string is made of 400 blocks in a series arrangement. Additionally, each block includes 5 cells in parallel. An interval observer aims to estimate the range of SOC values across the battery pack, with guaranteed provable inclusion and stability properties, which will be discussed in the subsequent sections.

This section reviews an ECM coupled with a two-state thermal model for a single battery cell, which is then electrically and thermally interconnected with other cell models to form a parallel arrangement of cells.

Single Battery Cell

Figure 1A:
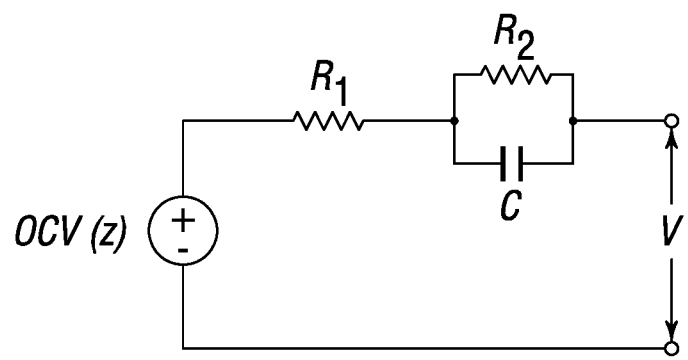
FIG. 1A shows a schematic for the ECM for a single cell.

The ECM for a single cell, shown in FIG. 1A, is described by the following continuous-time dynamical equations, $$dz_k(t)/dt = (1/Q_k)I_k(t); \quad (1)$$

$$dV_{c,k}(t)/dt = -(1/R_{2,k}(z_k,T_k)C_k(z_k,T_k))V_{c,k}(t) + (1/C_k(z_k,T_k))I_k(t) \quad (2)$$

$$V_k(t) = OCV(z_k(t)) + V_{c,k}(t) + R_{1,k}(z_k,T_k)I_k(t) \quad (3)$$

where $z_k(t)$ represents the SOC for the k-th cell, $V_{c,k}(t)$ denotes the voltage across the R-C pair for the kth cell, $V_k(t)$ represents the voltage at the output of the k-th cell, and $I_k(t)$ represents the current flowing across the $R_1$ and the R-C pair in the k-th cell. The symbol $T_k$ is the cell temperature that will be defined later. The electrical model parameters, namely, $R_{1,k}$, $R_{2,k}$, and $C_k$, are dependent on SOC and cell temperature, and such dependence can be explicitly characterized via an offline experimental procedure for a cell of interest (for example, for a LiFePO4/Graphite cell). The output eq. (3) for the k-th cell provides the voltage response characterized by a nonlinear open circuit voltage (OCV) as a function of SOC, voltage from the R-C pair, and voltage associated with an ohmic resistance $R_{1,k}$. Herein, positive current is specified for charging and negative current is specified for discharging.

In a two-state thermal model of the k-th cell, the model states are cell core temperature and surface temperature:

$$C_c dT_{c,k}(t)/dt = \dot{Q}_k(t) + ((T_{s,k}(t) - T_{c,k}(t))/R_c \quad (4)$$

$$C_s dT_{s,k}(t)/dt = ((T_{f,k}(t) - T_{s,k}(t))/R_u - ((T_{s,k}(t) - T_{c,k}(t))/R_c \quad (5)$$

$$\dot{Q}_k(t) = |I_k(t)(V_k(t) - OCV(z_k(t)))| \quad (6)$$

$$T_k(t) = \frac{1}{2}(T_{s,k}(t) - T_{c,k}(t)) \quad (7)$$

where $T_{c,k}$ and $T_{s,k}$ are the core and surface temperatures for the k-th cell. Symbols $R_c$, $R_u$, $C_c$, and $C_s$ represent heat conduction resistance between core and surface, convection resistance between ambient and surface, core heat capacity, and surface heat capacity, respectively. In this framework, symbol $\dot{Q}_k(t) \geq 0$ is the internal heat generation from resistive dissipation. Note that the electrical model, as represented by eqs. (1)-(3), and the thermal model, as represented by eqs. (4)-(7), are coupled via internal heat generation $\dot{Q}_k(t)$ in a nonlinear fashion.

The measured quantities for the coupled electrical-thermal model (1)-(7) are the cell voltage and surface temperature:

$$y_k(t) = [V_k(t), T_{s,k}(t)] \quad (8)$$

Parallel Arrangement of Battery Cells

Figure 1B:
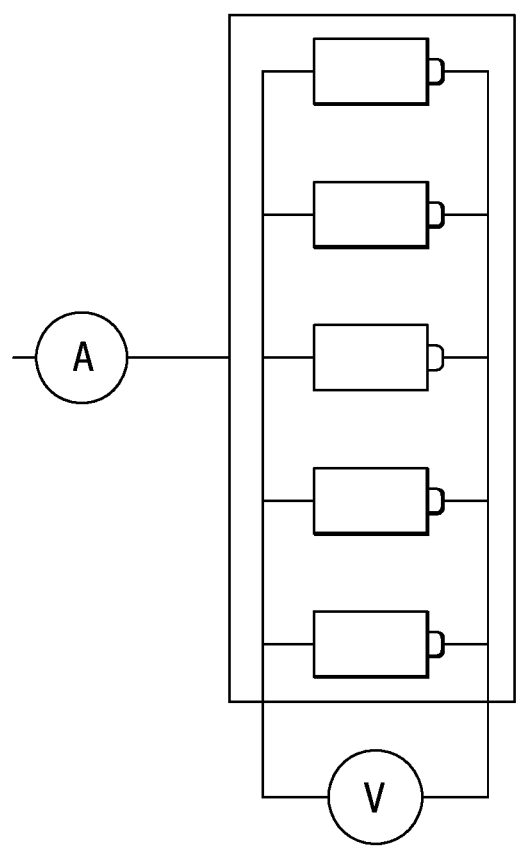
FIG. 1B shows a schematic of five cells in parallel.

For a block of m cells in parallel (shown in FIG. 1B for m=5), in order to reduce sensing effort, it is assumed that only the total current and voltage for one of the cells are measured. Electrically, Kirchhoff's voltage law indicates that a parallel connection of cells constraints terminal voltage to the same value for all cells. Kirchhoff's current law indicates that the overall current is equal to the summation of cell local currents. Mathematically, the following nonlinear algebraic constraints, according to Kirchhoff's voltage law, need to be enforced:

$$OCV(z_i) + V_{c,i} + R_{1,i}I_i = OCV(z_j) + V_{c,j} + R_{1,j}I_j \; i,j \in \{1,2,\ldots m\}, \; i \neq j \quad (9)$$

Similarly, Kirchhoff's current law poses the following linear algebraic constraint with respect to cell local currents, $$\Sigma I_k(t) = I(t), \; k=1 \text{ to } m \quad (10)$$

where $I(t)$ is the measured total current, and $I_k(t)$ represents the local current for cell k. It is worth highlighting that eq. (9) imposes (m−1) nonlinear algebraic constraints with respect to differential states and local currents, whereas eq. (10) imposes one algebraic constraint with respect to local currents. When only the total current is measured, the local cell currents are unknown. Hence, the system of differential-algebraic eqs. (1)-(10) must be solved such that the algebraic eqs. (9) and (10) are fulfilled for all t. This is realized by augmenting the local currents to the differential state vector to form a nonlinear descriptor system.

The cells are thermally coupled through coolant flow and heat exchange between adjacent cells.

For cell k, where $k = \{1, 2, \ldots, m\}$, $$C_c dT_{c,k}(t)/dt = \dot{Q}_k(t) + ((T_{s,k}(t) - T_{c,k}(t))/R_c \quad (11)$$

$$C_s dT_{s,k}(t)/dt = ((T_{f,k}(t) - T_{s,k}(t))/R_u - ((T_{s,k}(t) - T_{c,k}(t))/R_c + (T_{s,k-1}(t) + T_{s,k+1}(t) - 2T_{s,k}(t))/R_{cc} \quad (12)$$

$$T_{f,k}(t) = T_{f,k-1}(t) + (T_{s,k-1}(t) - T_{f,k-1}(t))/R_u C_f \quad (13)$$

$$\dot{Q}_k(t) = |I_k(t)(y_k(t) - OCV(z_k(t)))| \quad (14)$$

$$T_k(t) = (T_{s,k}(t) + T_{c,k}(t))/2 \quad (15)$$

where $T_{f,k}$ is the coolant flow temperature at the k-th cell, and $R_{cc}$ denotes heat conduction resistance between adjacent battery cell surfaces. Heat conduction between battery cells is driven by the temperature difference between cell surfaces, and this process is described by the third term on the right hand side of eq. (12). Inside the block of m cells in parallel, it is assumed that the coolant flows through individual cells, and the coolant flow temperature at the k-th cell is determined by the flow heat balance of the previous cell, as illustrated in eq. (13). Here it is also assumed that all the battery cells have the same thermal parameters.

Analysis for Cell Heterogeneity

Figure 2A:
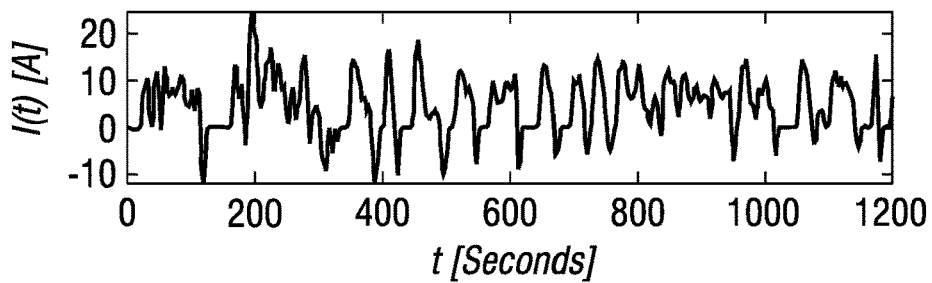
FIG. 2A shows the input current profile for the simulation study

In this section, the heterogeneity for cells in parallel via an open-loop simulation study is presented. Without loss of generality, two $LiNiMnCoO_2$/Graphite (NMC) type cells with 2.8 Ah nominal capacity in parallel are considered. In this embodiment, the cells have identical SOC-OCV relationship, and the heterogeneity arises from:

difference in SOC initialization
difference in electrical parameters due to SOC variation
unevenly distributed currents due to parameter variation
difference in temperature due to currents variation A transient electric vehicle-like charge/discharge cycle generated from the urban dynamometer driving schedule (UDDS) is applied. Specifically, this total applied current (summation of local currents) is plotted in FIG. 2A.

Figure 2B:
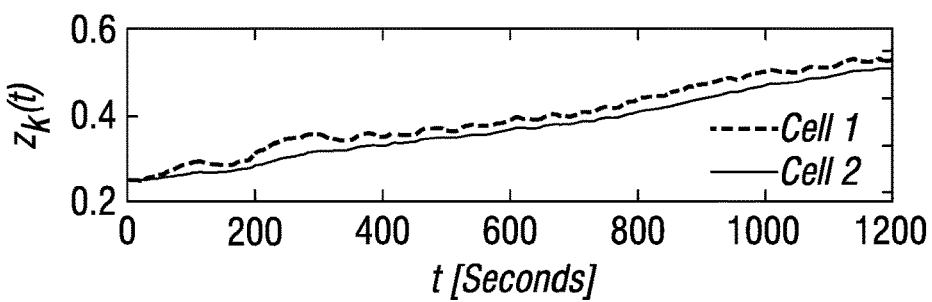
FIGS. 2B-2C show the cell heterogeneity of two battery cells in parallel under same initial conditions for the state of charge.
Figure 2C:
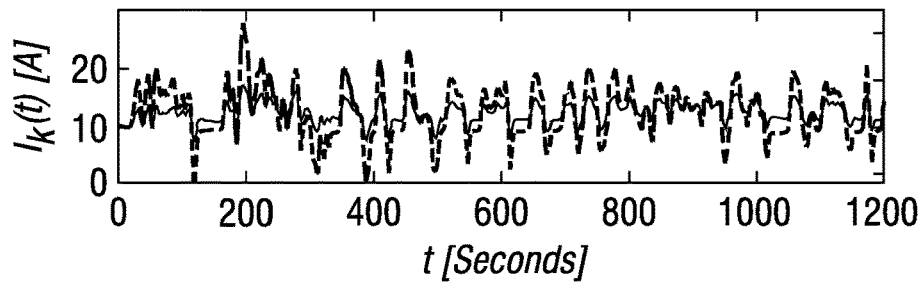
Figure 2D:
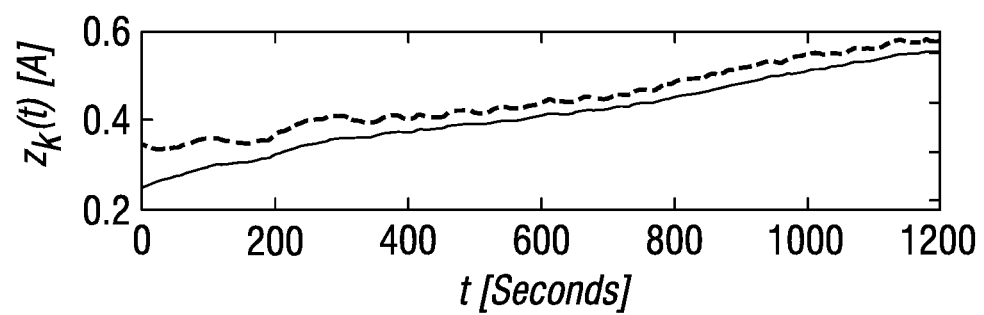
FIGS. 2D-2E show the cell heterogeneity of two battery cells in parallel under different initial conditions for the state of charge.
Figure 2E:
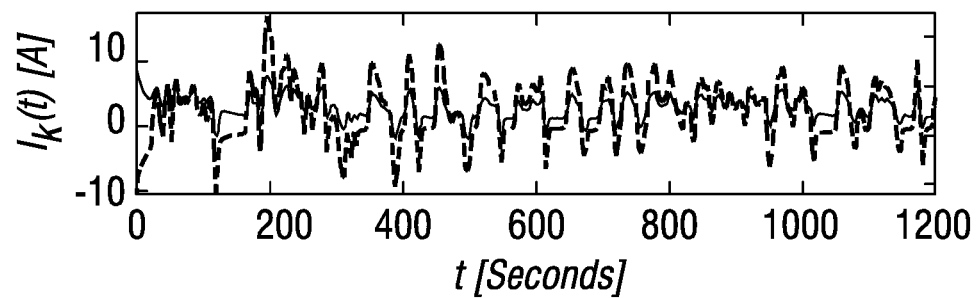

Two cases are examined here. In the first case, the cells are initialized at the same SOC, $z_k(0) = 0.25$ for $k \in \{1,2\}$. Since Cell 2 has larger resistance, its local current is smaller in magnitude relative to the local current of Cell 1, while the summation of the local currents equals to the total applied current for all t, as shown in FIG. 2C and FIG. 2E. FIG. 2B shows the estimation of the SOC for the two cells. FIGS. 2D and 2E demonstrate the second case where the cells have different $z_k(0)$: $z_1(0)$ (Cell 1) at 0.35 and $z_2(0)$ (Cell 2) at 0.25. It can be observed that even though the applied total current is small (around zero) initially, Cell 1 takes large negative current (around −10 A) and Cell 2 positions itself at a large positive current (around 10 A). This occurs because $z_1(0)$ is initialized higher, and even though the z values for two cells follow a similar trend, they do not synchronize.

In a battery pack composed of hundreds or thousands of cells, executing state estimation algorithms based on a highly nonlinear and coupled model consist of differential-algebraic equations for every single cell in real-time. This would be mathematically intractable and involve tremendous computational burden. This motivates the present study on interval observers that generate an upper and a lower bound to enclose all $z_k(t)$ trajectories, thus reducing computation and design complexity.

Consider the following nonlinear model dynamics:

$$dx/dt = f(x) + B(\theta)u + \delta f(x, \theta) \quad (16)$$

$$y = h(x) + \delta h(\theta)u \quad (17)$$

where $x \in R^n$ is the state vector, and $u \in R$ and $y \in R$ are the system input and output, respectively. The considered system is single-input-single-output (SISO). The functions $f(x)$ and $h(x)$ are deterministic and smooth, and $\delta f$ is uncertain and assumed to be locally Lipschitz continuous with respect to x. It is noted that the nominal terms $f(x)$ and $h(x)$ can be freely assigned by the designer via the modification of $\delta f$ and $\delta h$. The initial conditions for the states belong to a compact set $x_0 \in [\underline{x}_0, x_0^-]$, where $\underline{x}_0$ and $x_0^-$ are given. Suppose the uncertain parameters $\theta(t)$ belong to a compact set $\Theta \in R^p$, where p is the number of uncertain parameters. The values of the parameter vector $\theta(t)$ are not available for measurement, and only the set of admissible values $\Theta$ is known.

From eqs. (16)-(17) by setting $B=0$, $\delta f=0$, $\delta h=0$, one obtains $$dx/dt = f(x) \quad (18)$$

$$y = h(x) \quad (19)$$

A coordinate transformation obtained from the locally observable nominal system (18)-(19) is then utilized to transform the original uncertain system (16)-(17) into a partial linear system.

In particular, by denoting the gradient of a scalar field h by dh, and the Lie derivative of h along a vector field f is defined by the inner product $L_f h(x) = \langle dh(x), f(x) \rangle$. High-order Lie derivatives are computed with the iteration $L_f^k h(x) = L_f(L_f^{k-1}h(x))$ where $L_f^0 h(x) = h(x)$. The local observability matrix around an equilibrium point for the states $x = x_e$ is given by $$O(x_e) = \begin{bmatrix} dh(x_e) \\ dL_f h(x_e) \\ \vdots \\ dL_f^{n-1} h(x_e) \end{bmatrix}$$

The nominal system (18)-(19) is locally observable around $x = x_e$ if the matrix $O(x_e)$ is of rank n.

If the system (18)-(19) is locally observable, then the vectors $h(x), L_f h(x), \ldots, L_f^{n-1}(x)$ form the new coordinate for the sates in a neighborhood pf x defined by $$\Phi(x) = \begin{bmatrix} \varphi_1(x) \\ \varphi_2(x) \\ \vdots \\ \varphi_n(x) \end{bmatrix} = \begin{bmatrix} h(x) \\ L_f h(x) \\ \vdots \\ L_f^{n-1} h(x) \end{bmatrix} \text{ and the transformation map}$$

$$[\xi_1 \; \xi_2 \; \ldots \; \xi_n]^T = [\varphi_1(x) \; \varphi_2(x) \; \ldots \; \varphi_n(x)]^T$$

is a local diffeomorphism. The coordinate transformation obtained from the locally observable nominal system (18)-(19) is then utilized to transform the original uncertain system (16)-(17) into a partial-linear expression $$d\xi/dt = A_0 \xi + \delta A(\theta) \xi + b(\xi, \theta) \quad (20)$$

$$y = H\xi + v(\theta, t) \quad (21)$$

where $v(\theta, t) = \delta h(\theta) u$. The matrix $A_0 \varepsilon R^n$ is deterministic and the matrix $\delta A(\theta) \varepsilon R^n$ represents the uncertain part inherited from the uncertain nonlinear system (16)-(17). Symbol $b(\xi, \theta)$ indicates a lumped uncertain nonlinear function.

Interval Observer for Batteries

In this section, the interval observer design introduced previously is applied to the Li-ion battery state estimation problem. Four scenarios are examined: (i) interval observer for SOC of a single battery cell with temperature and SOC dependent electrical parameters; (ii) interval observer for SOC of electrically and thermally coupled cells in parallel, with SOC and temperature-dependent electrical parameters; (iii) interval observer for SOC of electrically and thermally coupled cells in series, with SOC and temperature-dependent electrical parameters, and (iv) temperature-enhanced interval observer for SOC and temperature of electrically and thermally coupled cells in series, with SOC and temperature-dependent electrical parameters.

SOC Interval Observer for a Single Battery Cell

It is hereby assumed that the input current, terminal voltage and surface temperature of the k-th single cell are experimentally measured. Ideally, a deterministic state observer is supposed to be proposed and analyzed for the coupled nonlinear electrical-thermal system (1)-(8) to reconstruct the internal states, i.e. $z_k(t), V_{c;k}(t)$, and $T_{c;k}$. However, this approach becomes intractable due to the nonlinear coupling between electrical and thermal models, the nonlinear dependence of electrical parameters on internal states, as well as nonlinear voltage output function. To tackle this issue, the present embodiment suppresses the electrical parameters' dependence on the internal states, and treats these parameters as uncertain. Specifically, $\theta \varepsilon \Theta \subset R^4$, where $\theta = [R_{2,k} \; C_k \; Q_k]^T$. The objective is to design a robust interval observer, using the measurements, to determine the set of admissible values for cell SOC at each time instant, when the plant model is subject to bounded uncertainties in the parameters and states' initial conditions.

Let $\tau_k = 1/(R_{2,k} C_k)$, and consider a known nominal value $\tau_{k,0}$ such that $$\tau_k = \tau_{k,0} + \delta\tau_k \quad (22)$$

where $\tau_{k,0}$ is a deterministic scalar and $\delta\tau_k$ represents the uncertain component. The single cell electrical system of eqs. (1)-(3) can thus be formulated in terms of uncertain system of eqs. (16)-(17) with:

$$x = \begin{pmatrix} x_1 \\ x_2 \end{pmatrix} = \begin{pmatrix} z_k \\ V_{c,k} \end{pmatrix}, \; f(x) = \begin{pmatrix} 0 \\ -\tau_{k,0} x_2 \end{pmatrix} \quad (23)$$

$$\delta f(x, \theta) = \begin{pmatrix} 0 \\ -\delta\tau_k x_2 \end{pmatrix}, \; B(\theta) = \begin{pmatrix} 1/Q_k \\ 1/C_k \end{pmatrix}, \; u = I_k(t),$$

$$h(x) = OCV(x_1) + x_2, \; \delta h(\theta) = R_{1,k}$$

It is assumed that the following upper and lower bounds are imposed on the uncertain parameters, $$Q_k \varepsilon [\underline{Q_k}, Q_k^-], C_k \varepsilon [\underline{C_k}, C_k^-], \delta_{\tau k} \varepsilon [\underline{\delta}_{\tau k}, \underline{\delta}_{\tau k}], R_{1,k} \varepsilon [\underline{R_{1,k}}, R_{1,k}^-], \quad (24)$$

so that $\Theta$ is a four-dimensional polytope. The local observability matrix for the nominal system is then given by $$O(x) = \begin{pmatrix} dh(x) \\ dL_f h(x) \end{pmatrix} = \begin{bmatrix} dOCV/dx_1(x_1) & 1 \\ 0 & -\tau_{k,0} \end{bmatrix} \quad (25)$$

whose rank is 2 if and only if the first derivative of the OCV function with respect to SOC is non-zero around an equilibrium point $x_1 = x_{1,e}$ and $\tau_{k,0} \neq 0$, i.e., $$dOCV/dx_1(x_{1,e}) \neq 0, \; \tau_{k,0} \neq 0 \quad (26)$$

which aligns with existing results on local observability for battery models. Hence, the coordinate transformation based on Lie algebra $$\Phi(x) = \begin{pmatrix} \xi_1 \\ \xi_2 \end{pmatrix} = \begin{pmatrix} OCV(x_1) + x_2 \\ -\tau_{k,0} x_2 \end{pmatrix} \quad (27)$$

transforms the system (16), (17) with (23) to the non-linear parameter-varying system (20)-(21), with $$A_0 = \begin{bmatrix} 0 & 1 \\ 0 & -\tau_{k,0} \end{bmatrix}, \; \delta A(\theta) = \begin{bmatrix} 0 & \delta\tau_k/\tau_{k,0} \\ 0 & -\delta\tau_k \end{bmatrix},$$

-continued $$b(\xi, \theta) = \begin{pmatrix} (1/Q_k)\varphi(\xi_1 + \xi_2/\tau_{k,0}) + 1/C_k \\ -\tau_{k,o}/C_k \end{pmatrix} I, H = [1, 0], \quad (28)$$

where $\varphi(\cdot) = dOCV/dx(OCV^{-1}(\cdot))$ (29)

An interval observer is designed according to Stanislav Chebotarev et al. "Interval observers for continuous-time LPV systems with L1/L2 performance", Automatica, 58:82-89, 2015. The bounding functions $\delta A^-$ and $\underline{\delta A}$ for $\delta A$ are obtained by applying the parameter bounds in (24). The bounding functions $b(t)^-$ and $\underline{b}(t)$ for $b(\xi,\theta)$ are evaluated according to the direction of current I(t) for all t.

SOC Interval Observer for Battery Cells in Parallel

As opposed to having one interval observer for each single cell in the preceding discussion, the present design is generalized for a cluster of battery cells connected in parallel. One practical advantage for using an interval observer for a group of cells is scalabilty. An interval observer, composed of only two dynamical systems estimating upper and lower bounds that all trajectories of unknown internal states live in, significantly reduces computation and design effort. For instance, consider two cells in parallel as studied previously and FIGS. 2A-2E. Due to cell heterogeneity, an interval observer is capable of constructing two trajectories that upper and lower bound all SOC trajectories, without dealing with the differential-algebraic nature of the circuit dynamics.

The interval observer design for parallel cells inherits the essence of the design for single cells. The only difference is to compute a single set of bounding functions that bound uncertainties from each cell in the parallel configuration.

A crucial step in designing interval observers for cells in parallel is to find the bounding functions for the uncertainties. Namely, the bounding functions are closely associated with the instantaneous bounds on the local currents. However, unlike the single cell scenario, the local currents of parallel cells are not available for measurement. Here, it is assumed that appropriate bounds on the local currents are given.

The width/tightness of the estimated intervals is dependent on the magnitude of model uncertainties, and the knowledge of the uncertainties when defining the bounding functions.

SOC Interval Observer for a Battery Cells in Series

Figure 1C:
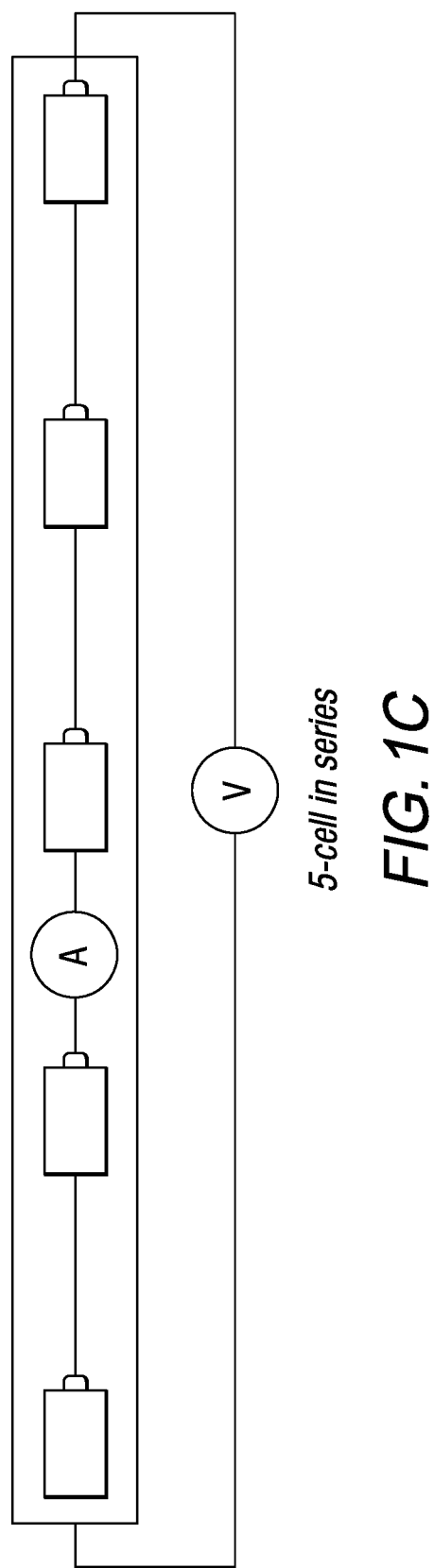
FIG. 1C shows a schematic of five cells in series.

According to the above, for a single cell modelled by ECM $$dz_k/dt = (1/Q_k)I(t); \quad (30)$$

$$dV_{c,k}/dt = -(1/R_{2,k}C_k)V_{c,k} + (1/C_k)I(t) \quad (31)$$

$$y_k = OCV(z_k) + V_{c,k} + R_{1,k}I(t) \quad (32)$$

where k∈{1, 2, N} and N is the total number of cells connected in series (see, for example, FIG. 1(C) for N=5). The above model can be re-expressed into the following general nonlinear system form:

$$dx_k/dt = f(x_k) + \delta f(x_k, \theta_k) + B(\theta_k)u \quad (33)$$

$$y_k = h(x_k) + \delta h(\theta_k)u, \quad (34)$$

with $$x_k = \begin{pmatrix} x_{k,1} \\ x_{k,2} \end{pmatrix} = \begin{pmatrix} z_k \\ V_{c,k} \end{pmatrix}, f(x) = \begin{pmatrix} 0 \\ -\tau_0 x_{k,2} \end{pmatrix}, \quad (35)$$

-continued $$\delta f(x_k, \theta_k) = \begin{pmatrix} 0 \\ -\delta\tau_k x_{k,2} \end{pmatrix}, B(\theta_k) = \begin{pmatrix} 1/Q_k \\ 1/C_k \end{pmatrix}, u = I_k(t),$$

$$h(x_k) = OCV(x_{k,1}) + x_{k,2},$$

$$\delta h(\theta_k) = R_{1,k} \text{ and } \tau_k = 1/R_{2,k}C_k = \tau_0 + \delta\tau_k$$

where $\tau_0$ is a user defined nominal value (assumed greater than zero), $\delta\tau_k$ is an uncertain parameter, and $\theta_k$ is the uncertain parameter vector $\theta_k = [R_{1,k} R_{2,k} C_k Q_k]$, for all k∈{1, 2, N}.

By setting B=0, δf=0 and δh=0, in eqs. (33)-(34), one obtains an uncertainty free nominal system $$dx_k/dt = f(x_k) \quad (36)$$

$$y_k = h(x_k) \quad (37)$$

Using the transformation of coordinates $\Theta(x_k)$, where $$\Phi(x_k) = \begin{pmatrix} \xi_{k,1} \\ \xi_{k,2} \end{pmatrix} = \begin{pmatrix} \varphi_1(x_k) \\ \varphi_2(x_k) \end{pmatrix} = \begin{pmatrix} OCV(x_{k,1}) + x_{k,2} \\ -\tau_0 x_{k,2} \end{pmatrix} \quad (38)$$

obtained from the nominal locally observable system (36)-(37), the original uncertain system (33)-(34) can be transformed into the following dynamical equations:

$$d\xi_k/dt = A_0\xi_k + \delta A(\theta_k)\xi_k + b(\xi_k, \theta_k, u) \quad (39)$$

$$y_k = H\xi_k + \delta h(\theta_k)u \quad (40)$$

where $$A_0 = \begin{bmatrix} 0 & 1 \\ 0 & -\tau_0 \end{bmatrix}, \delta A(\theta_k) = \begin{bmatrix} 0 & \delta\tau_k/\tau_0 \\ 0 & -\delta\tau_k \end{bmatrix},$$

$$b(\xi_k, \theta_k, u) = \begin{pmatrix} (1/Q_k)\varphi(\xi_{k,1} + \xi_{k,2}/\tau_0) + 1/C_k \\ -\tau_0/C_k \end{pmatrix} I, H = [1, 0],$$

and $$\varphi(\cdot) = dOCV/dx_{k,1}(OCV^{-1}(\cdot)) \quad (41)$$

Temperature Enhanced SOC Interval Observer—Coupled with an Interval Observer for Battery Core and Surface Temperature The temperature dynamics for a cell can be described by (where the symbols are the same as in Eqs. (4)-(6))

$$C_c dT_c(t)/dt = \dot{Q}(t) + ((T_s(t) - T_c(t))/R_c \quad (41)$$

$$C_s dT_s(t)/dt = (T_f - T_s(t))/R_u - ((T_s(t) - T_c(t))/R_c \quad (42)$$

$$\dot{Q}(t) = I(t)[y(t) - OCV(z_k(t))] \quad (43)$$

$$y_T(t) = T_s(t) \quad (44)$$

which is then re-arranged into $$dx(t)/dt = Ax(t) + Bu(t) + D\dot{Q}(t) \quad (45)$$

$$y(t) = Cx(t) \quad (46)$$

where $$x = \begin{pmatrix} T_c \\ T_s \end{pmatrix}, A = \begin{bmatrix} -1/R_cC_c & 1/R_cC_c \\ 1/R_cC_s & -\left(\frac{1}{R_uC_s} + \frac{1}{R_cC_s}\right) \end{bmatrix},$$

$$B = \begin{pmatrix} 0 \\ 1/R_uC_s \end{pmatrix}, D = \begin{pmatrix} 1/C_s \\ 0 \end{pmatrix}, C = [0, 1], u = T_f$$

In the design of an interval observer for the above thermal model, it is assumed that the thermal parameters $R_c$, $C_c$, $R_u$, and $C_s$ are constant, i.e., no parametric uncertainties in the model. Here, it is the internal heat generation term, i.e. $\dot{Q}(t)$, that is treated as the uncertainty entering the model. From Eq. (43), since $I(t)$ is measured, the max and min of voltages ($\bar{y}$ and $\underline{y}$) are accessible, and the upper and lower bounds of z are inherited from the electrical model interval observer, the upper and lower bounds for $\dot{Q}(t)$ can be computed. For example, if current is positive ($I(t)>0$), then $$\overline{\dot{Q}(t)} = I(t)[\bar{y}(t) - OCV(\underline{z}(t))], \underline{\dot{Q}(t)} = I(t)[\underline{y}(t) - OCV(\bar{z}(t))] \quad (47)$$

The thermal model (45)-(46) can be reformulated as $$dx/dt = Ax + Bu + D\dot{Q}(t) + K(y_T - Hx) = (A-KC)x + Bu + Ddq/dt + Ly_T \quad (48)$$

First, $K = [K_1 \ K_2]^T$ needs to be chosen such that the matrix $(A-KC)$ is Hurwitz and Metzler. Since $$(A - KC) = \begin{bmatrix} -1/R_cC_c & \frac{1}{R_cC_c} - K_1 \\ -1/R_cC_s & -\left(\frac{1}{R_uC_s} + \frac{1}{R_cC_s}\right) - K_2 \end{bmatrix}, \quad (49)$$

$L1 \leq 1/R_cC_c$ is required. In addition, since matrix A is itself Hurwitz, the choice of a positively small $K_1$ and a positively large $K_2$ would enforce the matrix $(A-KC)$ to be Hurwitz and Metzler.

The interval observer is then $$d\bar{x}/dt = (A-KC)\bar{x} + Bu + D\overline{\dot{Q}(t)} + L\bar{y_T} \quad (50)$$

$$d\underline{x}/dt = (A-KC)\underline{x} + Bu + D\underline{\dot{Q}(t)} + L\underline{y_T} \quad (51)$$

The dynamics for the estimation error $\bar{e} = \bar{x} - x$ and $\underline{e} = x - \underline{x}$ are given by $$d\bar{e}/dt = (A-KC)\bar{e} + D(\overline{\dot{Q}(t)} - \dot{Q}(t)) + K(\bar{y_T} - y_T), \quad (52)$$

$$d\underline{e}/dt = (A-KC)\underline{e} + D(\dot{Q}(t) - \underline{\dot{Q}(t)}) + K(y_T - \underline{y_T}) \quad (53)$$

where $\bar{e} \geq 0$ and $\underline{e} \geq 0$ according to monotonic system theory.

Figure 5:
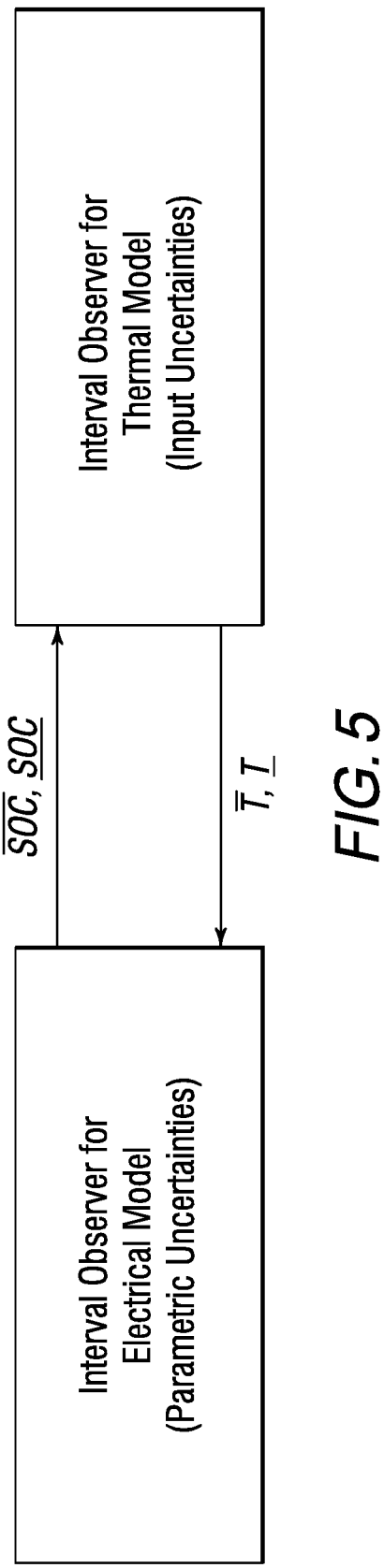
FIG. 5 shows a schematic for the interrelation between the interval observer for the electrical model and the interval observer for the thermal model.

Thus, an interval observer for core temperature can then be designed, by treating the heat generation $\dot{Q}_k(t)$ uncertain, and only using the max and min surface temperature information. As shown in FIG. 5, the interval observer for the battery pack thermal model is used to estimate the range of core and surface temperature uncertainties $\bar{T}$ and $\underline{T}$ of the battery cells, then enhance the interval observer for SOC.

Results

In order to validate the interval observer design, numerical studies are carried out on NMC battery cells modeled with a lumped electrical-thermal model (1)-(10). The state-dependent electrical model parameters are taken from Xinfan Lin et al. "A lumped parameter electro-thermal model for cylindrical batteries", J. of Power Sources, 257:1-11, 2014. The total current fed to the battery is a UDDS driving cycle. The interval observer is used to estimate the lower and upper bounds on the internal states from only total current and voltage measurements. Three scenarios are considered. First, the state estimation of a single battery cell is tested, which accounts for uncertainties linked to SOC and temperature dependent parameters. Then, the same observer is used to estimate the state interval for a parallel arrangement of five cells, which involves uncertainty due to cell heterogeneity as well as SOC and temperature dependent parameters. Last, a temperature-enhanced interval observer is used to estimate the state interval for a series arrangement of five cells, which involves uncertainty due to cell heterogeneity as well as SOC and temperature dependent parameters.

Interval Observer for Single Battery Cell

Figure 3A:
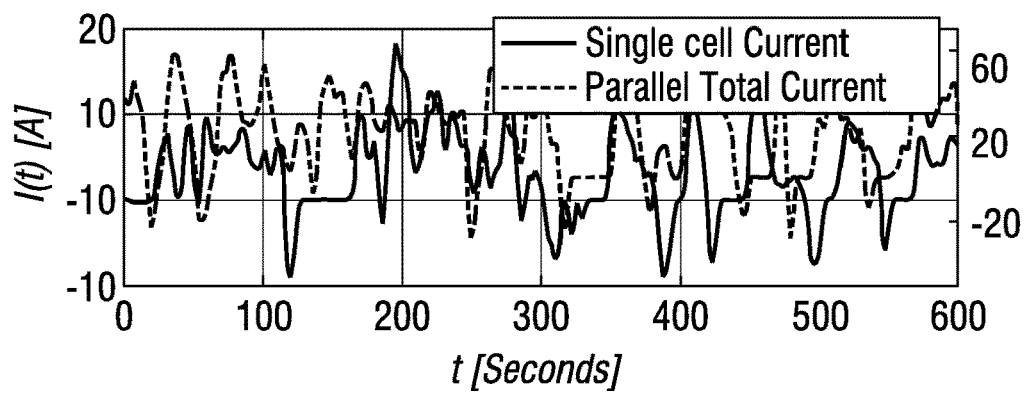
FIGS. 3A-3C show the performance of interval observer when estimating the state of charge of a single battery cell and five cells in parallel for one set of initial conditions for the state of charge.
Figure 3B:
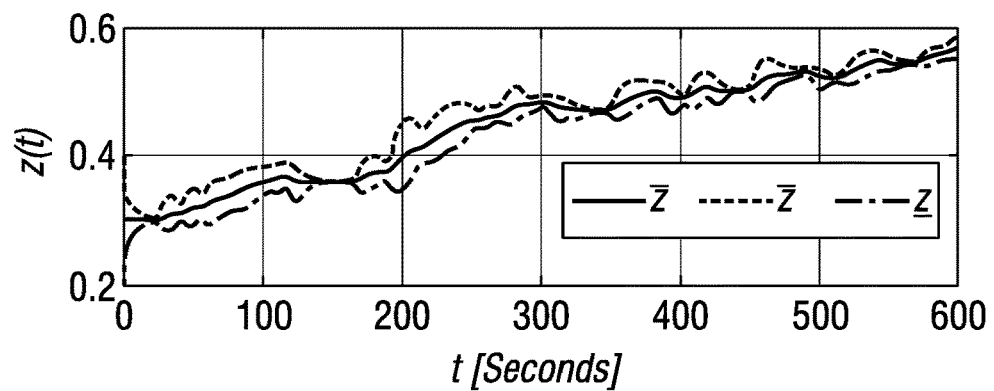

A single cell and design of the interval observer according to the previous section is considered. As shown in FIG. 3B, the initial value for the SOC trajectory simulated from the plant model is 30%, and the initial values on the interval observers (lower and upper bounds) are 20% and 40%. The observer gains are chosen to be $\underline{L} = [10 - 0.1]^T$ and $L^- = [10 - 0.1]^T$. FIG. 3A shows the applied measured current, and FIG. 3B shows the estimation performance for SOC. The solid curve is the plant model simulated SOC and the dashed curves correspond to the estimation, with upper bounds and lower bounds. From these plots, the lower and upper bound estimates computed from the interval observer are able to recover quickly (less than c.a. 20 s) from large initial errors and always enclose the true SOC of the battery. These results confirm the stability and inclusion properties of the designed interval observer, given uncertain initial conditions and state-dependent parameters.

Internal Observer for Battery Cells in Parallel

Figure 3C:
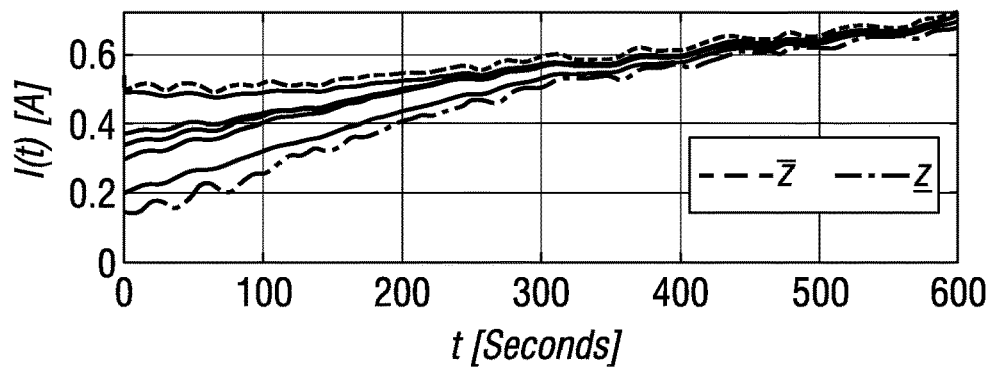

A parallel arrangement of five cells, which differ in their initial SOCs and model parameters is considered. The interval observer is designed according to the previous sections. The initial SOCs are 20%, 30%, 34%, 37%, and 49%, and the initial bounds (interval observer) on SOCs are 15% and 54%. FIG. 3C shows the estimation performance for SOC, and FIG. 3A shows the measured total current, which is the summation of all the cell local currents. The solid curves represent the true SOC of each cell in the parallel arrangement, and dashed curves are the lower and upper bound estimates. These plots show that the bound estimates provided by the interval observer are close to the minimum and maximum values of the state during its temporal evolution. They also envelop the state distribution across the five cells. Therefore, the results show that cell heterogeneity can be included as unknown but bounded uncertainties, which can be exploited to develop an interval observer that provides reliable bound estimates for the system state. Moreover, stability and inclusion of the observer are guaranteed.

Temperature Enhanced Interval Observer for Battery Cells in Series

Figure 4A:
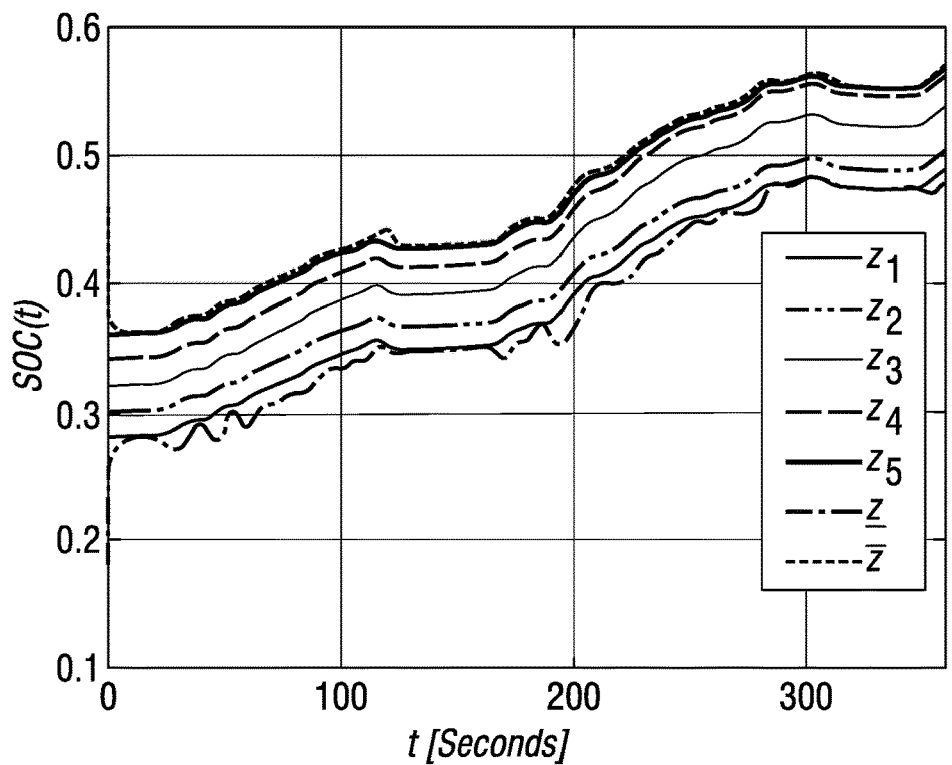
FIG. 4A shows the performance of temperature-enhanced interval observer when estimating the state of charge of five battery cells in series for another set of initial conditions for the state of charge.
Figure 4B:
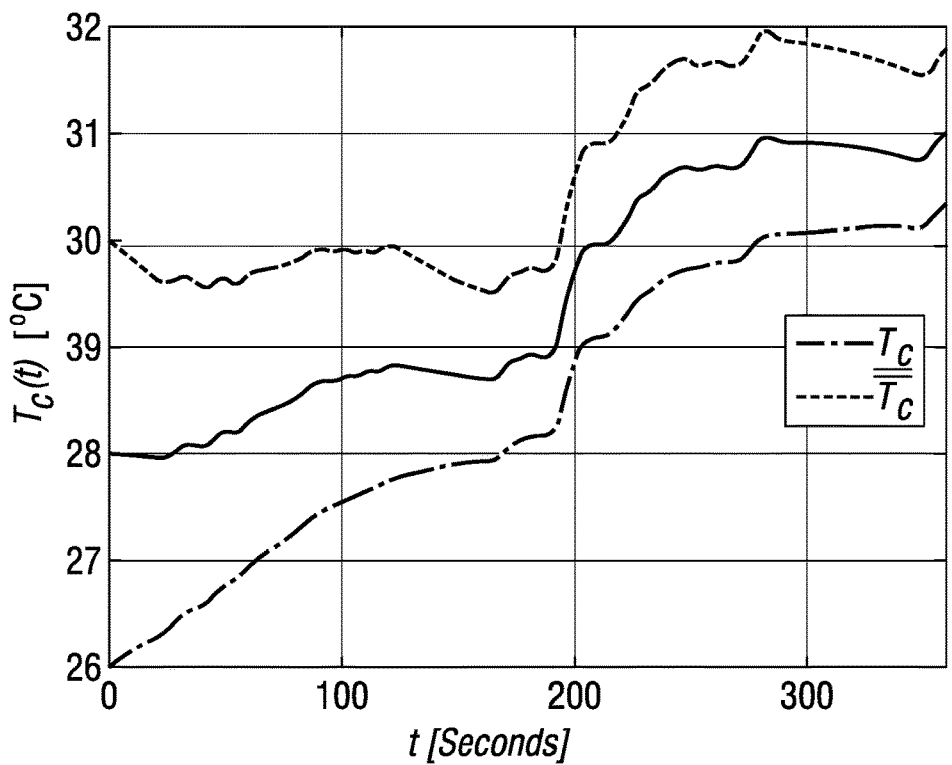
FIG. 4B shows the performance of temperature-enhanced interval observer when estimating the core temperature of five battery cells in series.

The interval observers described above (electrical model enhanced by the thermal model) were used for determining the SOC and core temperature of five sells in series. FIG. 4A shows the estimation performance for SOC for the five cells. Curves $z_1$ to $z_5$ represent the true SOC of each cell in the series arrangement, and dashed curves $\underline{z}$ and $\bar{z}$ are the lower and upper bound estimates. These plots show that the bound estimates provided by the interval observer are close to the minimum and maximum values of the state during its temporal evolution. They also envelop the state distribution across the five cells. FIG. 4B shows the estimation performance for the core temperature of the five cells. The solid curve represents the true $T_c$ of each cell in the series arrangement, and dashed curves are the lower and upper bound estimates of the $T_c$.

CONCLUSIONS

An interval observer based on an equivalent circuit-thermal model for lithium-ion batteries has been presented. The SOC-temperature-dependent parameters are considered as unknown but bounded uncertainties in the single cell model. Then, both parallel and series arrangements of five cells are used for observer design, where cell heterogeneity is now accounted for through the uncertainty bounding functions. Given that the reduced nominal battery model is locally observable, the original uncertain model can be transformed into a partial linear form for monotone systems, which enables interval estimation. By properly choosing the observer gains, the state matrix of the estimation error is Hurwitz and Metzler, which guarantees stability and inclusion of the state bound estimates. Furthermore, a temperature-enhanced interval observer is designed to simultaneously estimate the SOC and the core temperature of five battery cells. A major feature of the present estimation approach is its scalability, since the number of states of interval observers is independent of the number of cells. Simulation results showcase the effectiveness of the interval observer design.

Figure 6:
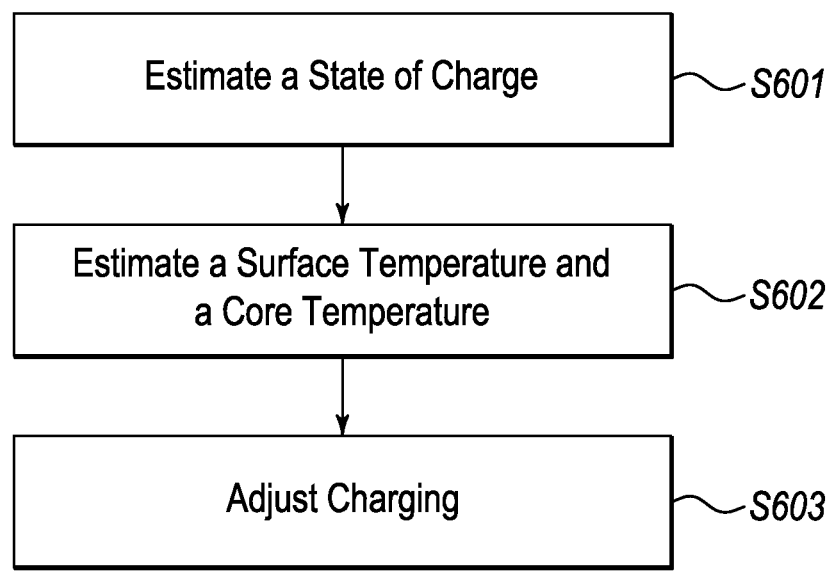
FIG. 6 shows a method according to embodiments disclosed herein.

FIG. 6 shows a method for operating batteries in line with the above-described approach. For example, in S601, a state of charge of the batteries is estimated; in S602, a surface temperature and a core temperature of the batteries are estimated; and in S603, charging of the batteries is adjusted based on the state of charge, the surface temperate, and the core temperature.

Numerous modifications and variations of the embodiments presented herein are possible in light of the above teachings. It is therefore to be understood that within the scope of the claims, the disclosure may be practiced otherwise than as specifically described herein.

The invention claimed is:

1. A method for operating batteries belonging in a battery pack comprising a plurality of cells of batteries, each of the cells being represented by an R-C pair comprising a resistor with resistance $R_2$ and a capacitor with capacitance C, the R-C pair being in series with a resistor with resistance $R_1$, the method comprising:

estimating a state of charge (SOC) of each of the cells of the batteries belonging in the battery pack based on a coupled electrical-thermal model, wherein the SOC of each of the cells is derived from the non-linear differential equation system:

$$d\xi/dt = A_0\xi + \delta A(\theta)\xi + b(\xi,\theta)$$

$$y = H\xi + v(\theta,t)$$

where $$\xi = \begin{pmatrix} \xi_1 \\ \xi_2 \end{pmatrix} = \begin{pmatrix} OCV(x_1) + x_2 \\ -\tau_{k,0}x_2 \end{pmatrix}$$

$$A_0 = \begin{bmatrix} 0 & 1 \\ 0 & -\tau_{k,0} \end{bmatrix}, \delta A(\theta) = \begin{bmatrix} 0 & \delta\tau_k/\tau_{k,0} \\ 0 & -\delta\tau_k \end{bmatrix},$$

$$b(\xi,\theta) = \begin{pmatrix} (1/Q_k)\varphi(\xi_2/\tau_{k,0}) + 1/C_k \\ -\tau_{k,0}/C_k \end{pmatrix} I, H = [1, 0],$$

$\varphi(\leq) = dOCV/dx(OCV^{-1}(\cdot))$, $v(\theta,t) = \delta h(\theta)u$, where $u = I_k(t)\varepsilon R$ is a system input, where $I_k(t)$ is a current flowing in the k-th cell, $y\varepsilon R$ is a system output, $x\varepsilon R^n$ is a state vector, having a state $x_1 = z_k$ and a state $x_2 = V_{c,k}$, where $z_k(t)$ represents the SOC for the k-th cell, and $V_{c,k}(t)$ represents a voltage across the R-C pair in the k-th cell, t represents a time variable, OCV is an open circuit voltage across the k-th cell, $\tau_k = 1/R_{2,k}C_k = \tau_{k,0} + \delta\tau_k$ where $\tau_{k,0}$ is a deterministic scalar and $\delta\tau_k$ represents an uncertain component, $\dot{Q}_k(t)$ is an internal heat generation from resistive dissipation, $C_k$ is the capacitance of the capacitor in the R-C pair in the k-th cell, I is an identity matrix, $\delta h(\theta) = R_{1,k}$, $R_{1,k}$ is $R_1$ in the k-th cell, $R_{2,k}$ is $R_2$ in the k-th cell, where unknown quantities $Q_k$, $C_k$, $\delta_{\tau k}$ and $R_{1,k}$ have values belonging within intervals $[\underline{Q}_k, Q_k^-]$, $[\underline{C}_k, C_k^-]$, $[\underline{\delta}_{\tau k}, \delta_{\tau k}^-]$, and $[\underline{R}_{1,k}, R_{1,k}^-]$, respectively, with set upper and lower limits;

estimating a surface temperature $T_s$ and a core temperature $T_c$ for each of the cells, wherein the $T_s$ and the $T_c$ of each of the cells is derived from the non-linear differential equation system:

$$dx(t)/dt = Ax(t) + Bu(t) + D\dot{Q}(t)$$

$$y(t) = Cx(t)$$

where $$x = \begin{pmatrix} T_c \\ T_s \end{pmatrix}, A = \begin{bmatrix} -1/R_cC_c & 1/R_cC_c \\ 1/R_cC_c & -\left(\frac{1}{R_uC_s} + \frac{1}{R_cC_s}\right) \end{bmatrix},$$

$$B = \begin{pmatrix} 0 \\ 1/R_uC_s \end{pmatrix}, D = \begin{pmatrix} 1/C_s \\ 0 \end{pmatrix}, C = [0, 1], u = T_f$$

where $R_c$, $R_u$, $C_c$, and $C_s$ represent heat conduction resistance between core and surface, convection resistance between ambient and surface, core heat capacity, and surface heat capacity, respectively, and $T_f$ is a coolant flow temperature at a cell; and adjusting charging of the batteries based on the estimated SOC, $T_s$, and $T_c$ of each of the cells.

2. The method according to claim 1, wherein the battery pack comprises a string of a plurality of cells connected in series.

3. The method according to claim 2, wherein the battery pack comprises a plurality of strings of cells connected in parallel.

4. The method according to claim 1, wherein the battery pack comprises 20 strings of cells connected in parallel, each of the strings comprising 400 blocks of cells connected in series, each of the blocks comprising 5 cells connected in parallel.

\* \* \* \* \*